US008004652B2

(12) United States Patent
Mertens et al.

(10) Patent No.: US 8,004,652 B2
(45) Date of Patent: *Aug. 23, 2011

(54) LITHOGRAPHIC APPARATUS AND DEVICE MANUFACTURING METHOD

(75) Inventors: Jeroen Johannes Sophia Maria Mertens, Duizel (NL); Sjoerd Nicolaas Lambertus Donders, 's-Hertogenbosch (NL); Roelof Frederik De Graaf, Veldhoven (NL); Christiaan Alexander Hoogendam, Veldhoven (NL); Antonius Johannus Van Der Net, Tillburg (NL); Franciscus Johannes Herman Maria Teunissen, Rotterdam (NL); Patricius Aloysius Jacobus Tinnemans, Hapert (NL); Martinus Cornelis Maria Verhagen, Valkenswaard (NL); Jacobus Johannus Leonardus Hendricus Verspay, Thorn (NL); Edwin Van Gompel, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 470 days.

This patent is subject to a terminal disclaimer.

(21) Appl. No.: 12/078,635

(22) Filed: Apr. 2, 2008

(65) Prior Publication Data
US 2008/0259292 A1   Oct. 23, 2008

Related U.S. Application Data

(63) Continuation of application No. 10/966,108, filed on Oct. 18, 2004, now Pat. No. 7,379,155.

(51) Int. Cl.
G03B 27/42 (2006.01)
G03B 27/52 (2006.01)

(52) U.S. Cl. ............................ 355/53; 355/30

(58) Field of Classification Search ............ 355/30, 355/53, 55, 67; 250/548; 95/263–266
See application file for complete search history.

(56) References Cited

U.S. PATENT DOCUMENTS

| | | | |
|---|---|---|---|
| 3,314,219 A | 4/1967 | Griffin, III et al. |
| 3,573,975 A | 4/1971 | Dhaka et al. |
| 3,648,587 A | 3/1972 | Stevens |
| 3,675,395 A | 7/1972 | Baranowski |
| 4,315,760 A | 2/1982 | bij de Leij |
| 4,346,164 A | 8/1982 | Tabarelli et al. |

(Continued)

FOREIGN PATENT DOCUMENTS

DE       206 607       2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

Primary Examiner — Hung Henry Nguyen
(74) Attorney, Agent, or Firm — Pillsbury Winthrop Shaw Pittman LLP

(57) ABSTRACT

A lithographic apparatus is disclosed including a liquid supply system configured to at least partly fill a space between the projection system and the substrate with a liquid, an outlet configured to remove a mixture of liquid and gas passing through a gap between a liquid confinement structure of the liquid supply system and the substrate, and an evacuation system configured to draw the mixture through the outlet, the evacuation system having a separator tank arranged to separate liquid from gas in the mixture and a separator tank pressure controller, connected to a non-liquid-filled region of the separator tank, configured to maintain a stable pressure within the non-liquid-filled region.

26 Claims, 15 Drawing Sheets

U.S. PATENT DOCUMENTS

| | | | |
|---|---|---|---|
| 4,390,273 A | 6/1983 | Loebach et al. | |
| 4,396,705 A | 8/1983 | Akeyama et al. | |
| 4,466,253 A | 8/1984 | Jaster | |
| 4,480,910 A | 11/1984 | Takanashi et al. | |
| 4,509,852 A | 4/1985 | Tabarelli et al. | |
| 4,641,679 A * | 2/1987 | Arnaudeau et al. | 137/88 |
| 4,696,684 A | 9/1987 | Shen | |
| 4,704,140 A * | 11/1987 | Kujala | 95/19 |
| 4,730,634 A * | 3/1988 | Russell | 95/22 |
| 4,886,530 A * | 12/1989 | Dussourd | 96/217 |
| 5,040,020 A | 8/1991 | Rauschenbach et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,716,268 B2 | 4/2004 | Molyneux et al. | |
| 6,788,477 B2 | 9/2004 | Lin | |
| 6,954,256 B2 | 10/2005 | Flagello et al. | |
| 7,053,983 B2 * | 5/2006 | Tokita | 355/53 |
| 7,125,438 B2 | 10/2006 | Skoglund et al. | |
| 7,379,155 B2 * | 5/2008 | Mertens et al. | 355/53 |
| 2002/0020821 A1 | 2/2002 | Van Santen et al. | |
| 2002/0163629 A1 | 11/2002 | Switkes et al. | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0119954 A1 | 6/2004 | Kawashima et al. | |
| 2004/0125351 A1 | 7/2004 | Krautschik | |
| 2004/0135099 A1 | 7/2004 | Simon et al. | |
| 2004/0136494 A1 | 7/2004 | Lof et al. | |
| 2004/0154641 A1 | 8/2004 | Montierth | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0048220 A1 | 3/2005 | Mertens et al. | |
| 2005/0110973 A1 | 5/2005 | Streefkerk et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0140948 A1 | 6/2005 | Tokita | |
| 2005/0282405 A1 * | 12/2005 | Harpham et al. | 438/795 |
| 2006/0082746 A1 | 4/2006 | Mertens et al. | |
| 2006/0152697 A1 | 7/2006 | Poon et al. | |
| 2007/0195301 A1 | 8/2007 | Nagasaka | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 1039511 | 9/2000 |
| EP | 1 486 827 A2 | 12/2004 |
| EP | 1 489 462 A2 | 12/2004 |
| EP | 1 491 957 A2 | 12/2004 |
| EP | 1 528 433 A2 | 5/2005 |
| EP | 1 571 701 A1 | 9/2005 |
| FR | 2474708 | 7/1981 |
| JP | 58-202448 | 11/1983 |
| JP | A59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | 07-132262 | 5/1995 |
| JP | 07-220990 | 8/1995 |
| JP | A 08-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2002-257137 A | 9/2002 |
| JP | 2004-193252 | 7/2004 |
| JP | 2004-282023 A | 10/2004 |
| JP | A-2004-320016 | 11/2004 |
| JP | A-2004-320017 | 11/2004 |
| JP | 2005-175176 | 6/2005 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2005/024517 | 3/2005 |
| WO | WO 2005/122221 A1 | 12/2005 |
| WO | WO 2005/124464 A2 | 12/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12, (2002).

European Search Report issued for European Patent Application No. 05256461.4-2222 dated Feb. 16, 2006.

Information Disclosure Statement filed Apr. 19, 2007 for U.S. Appl. No. 11/785,722.

English Translation of Notice of Reasons for Rejection Application No. 2005-301607 dated Mar. 9, 2009 for Japanese Patent Application No. 2005-307607 dated Mar. 9, 2009.

U.S. Office Action issued for U.S. Appl. No. 10/869,191, dated Jan. 28, 2008.

* cited by examiner

LITHOGRAPHIC APPARATUS AND DEVICE MANUFACTURING METHOD

This application is a continuation of U.S. patent application Ser. No. 10/966,108 filed on Oct. 18, 2004 now U.S. Pat. No. 7,379,155, which is herein incorporated by reference in its entirety.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In a liquid supply system of lithographic apparatus, a mixture of liquid and gas may be extracted during operation of the liquid supply system. For example, one or more outlets in the liquid supply system of FIGS. 2 and 3 may extract a mixture of liquid and gas during exposure of the substrate. In another example, as discussed below in relation to FIG. 5, liquid and gas may be extracted to seal a gap between a liquid confinement structure and the substrate during exposure of the substrate. A disturbance in the flow of liquid and gas in these systems and in surrounding regions may negatively affect the imaging quality of the lithographic apparatus. Where a combination of liquid and gas is involved, there may be an issue of providing stable and reliable extraction due to the difficult flow properties of a liquid and gas mixture. Reliability may be a concern for example where damage to the lithography apparatus can occur following a failure in the liquid supply system or where an outage in the liquid supply system may cause delays in production.

Accordingly, it would be advantageous, for example, to provide an improved system and method for evacuating mixtures of liquid and gas from components in a lithographic apparatus.

According to an aspect of the invention, there is provided a lithographic apparatus comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate;

a liquid supply system configured to at least partly fill a space between the projection system and the substrate with a liquid, the liquid supply system comprising a liquid confinement structure configured to at least partly confine the liquid within the space;

an outlet configured to remove a mixture of liquid and gas passing through a gap between the liquid confinement structure and the substrate; and an evacuation system configured to draw the mixture through the outlet, the evacuation system comprising a separator tank arranged to separate liquid from gas in the mixture and a separator tank pressure controller, connected to a non-liquid-filled region of the separator tank, configured to maintain a stable pressure within the non-liquid-filled region.

According to a further aspect, there is provided an apparatus, comprising:

a pressurized gas input configured to provide gas under pressure to an interface region of a container from which liquid may escape;

a stabilized evacuation system configured to provide controlled removal of a mixture of liquid and gas from the region, the flow of gas caused by the pressurized gas input coupled with the stabilized evacuation system being configured to limit the escape of liquid from the container through the interface region, the stabilized evacuation system comprising a separator tank arranged to separate liquid from gas in the mixture and a separator tank pressure controller, connected to a non-liquid-filled region of the separator tank, configured to maintain a stable pressure within the non-liquid-filled region.

According to a further aspect, there is provided a lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate;

a liquid supply system configured to at least partly fill a space between the projection system and the substrate with a liquid, the liquid supply system comprising a liquid confinement structure configured to at least partly confine the liquid within the space;

an outlet configured to remove a mixture of liquid and gas passing through a gap between the liquid confinement structure and the substrate; and an evacuation system configured to draw the mixture through the outlet, the evacuation system comprising a two-phase compatible pump and a liquid/gas homogenizer arranged between the gap and the two-phase compatible pump, the liquid/gas homogenizer being arranged to provide a uniform mixture of liquid and gas to the two-phase compatible pump.

According to a further aspect, there is provided a lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate;

a liquid supply system configured to at least partly fill a space between the projection system and the substrate with a liquid, the liquid supply system comprising a liquid confinement structure configured to at least partly confine the liquid within the space;

an outlet configured to remove a mixture of liquid and gas passing through a gap between the liquid confinement structure and the substrate; and an evacuation system configured to draw the mixture through the outlet, the evacuation system, comprising:

a main pumping line connected to a two-phase compatible pump configured to pump the mixture, a backup line connectable to a shared vacuum facility configured to pump gas only and arranged to backup the two-phase compatible pump, the two-phase compatible pump being configurable to provide a deeper vacuum than the shared vacuum facility, and a two-phase-compatible pressure regulator connected to the main pumping line and the backup line.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
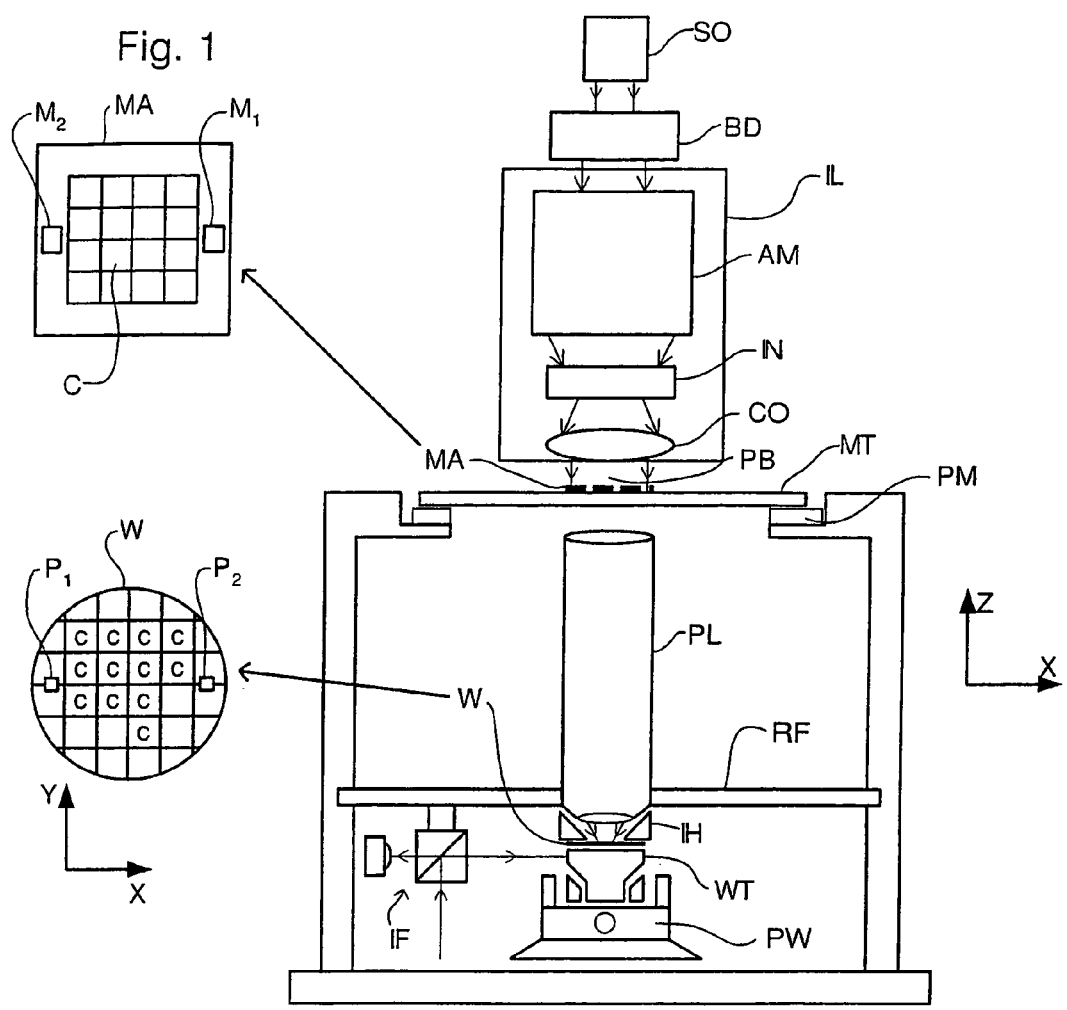
FIG. 1 depicts a lithographic apparatus according to an embodiment of the invention.
Figure 2:
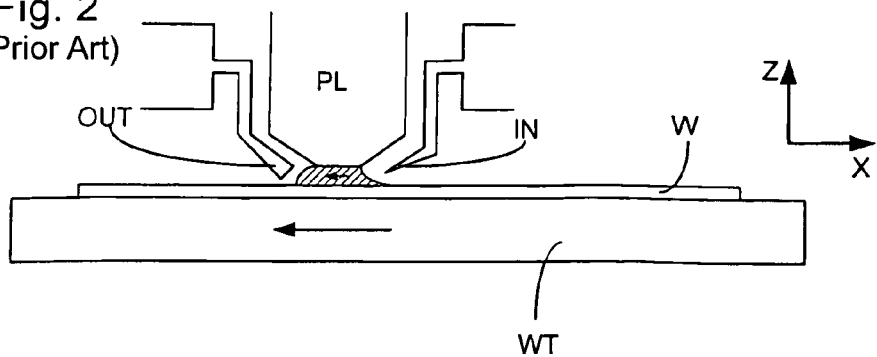
FIGS. 2 and 3 depict a liquid supply system for use in a lithographic projection apparatus.
Figure 3:
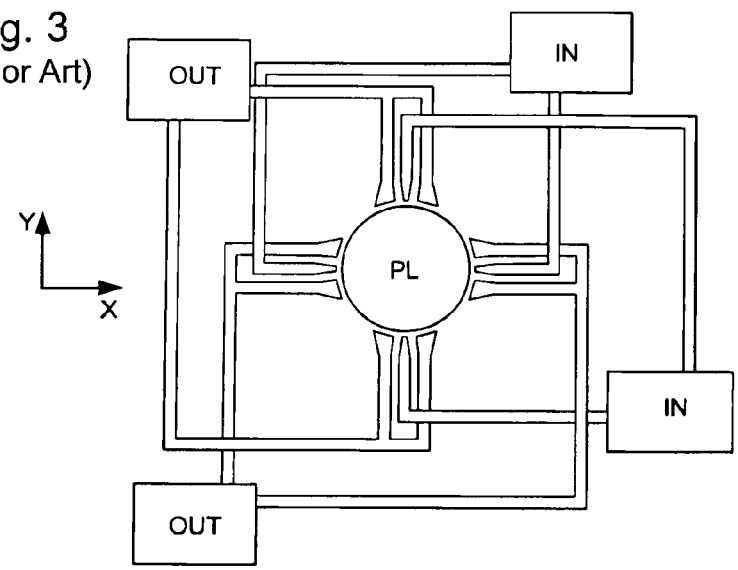

FIG. 1 schematically depicts a lithographic apparatus according to one embodiment of the invention. The apparatus comprises:

- an illumination system (illuminator) IL configured to condition a radiation beam PB (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
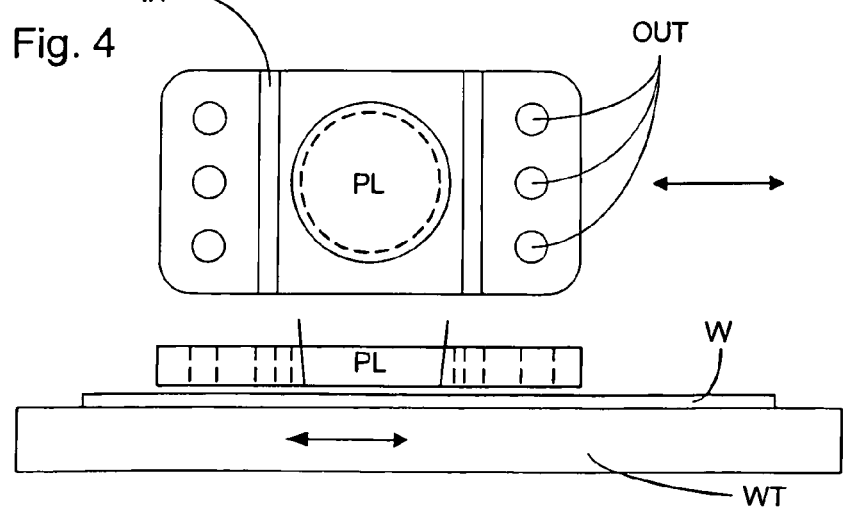
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
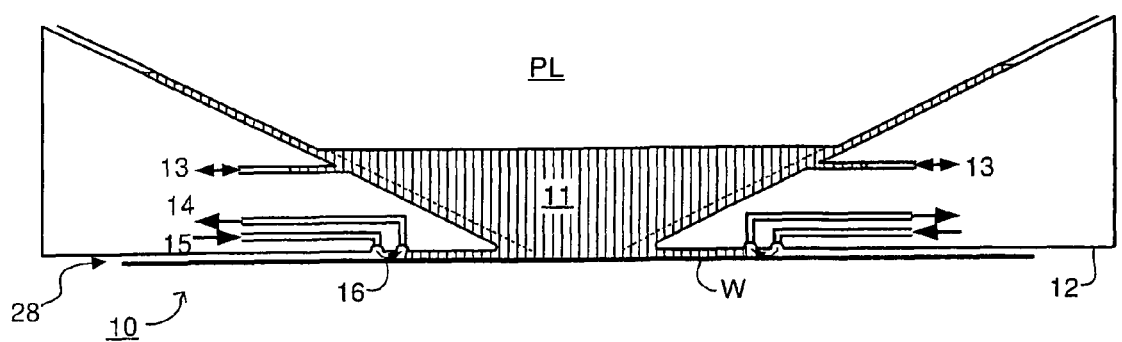
FIG. 5 depicts a further liquid supply system, comprising an immersion liquid reservoir with a liquid confinement structure and a gas seal, for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via an outlet to an evacuation system hose 14. The overpressure on the gas inlet 15, vacuum level on the outlet of the hose 14 and geometry of the gap are arranged so that there is a high-velocity gas flow inwards that confines the liquid. It will be understood by the person skilled in the art that other types of seal could be used to contain the liquid.

Figure 6:
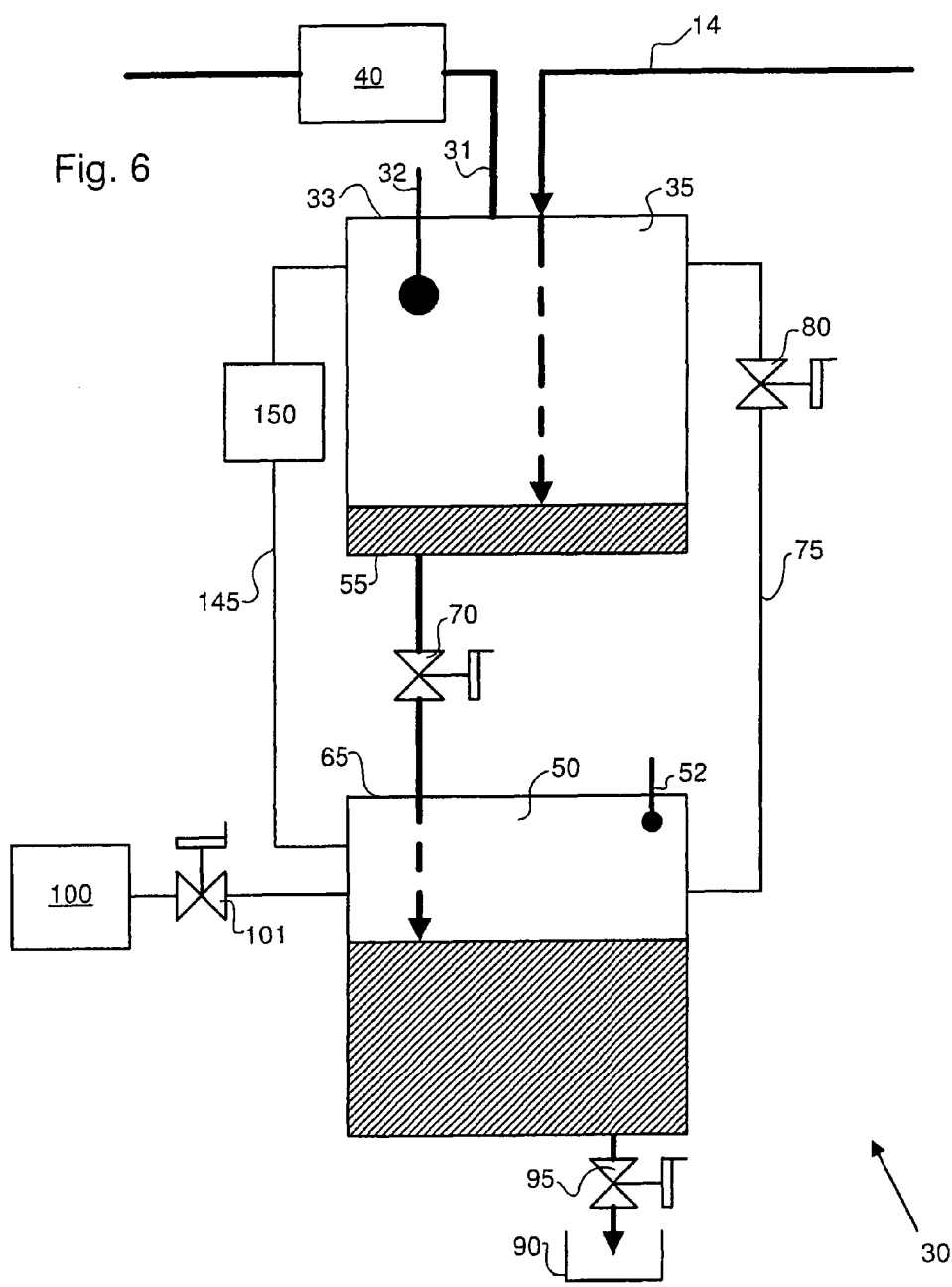
FIG. 6 depicts an evacuation system according to an embodiment of the invention, the system comprising a separator tank, a limited flow connection and a pressure equalization connection.

FIG. 6 shows an evacuation system 30 according to an embodiment of the invention. The evacuation system 30 provides the driving force for the removal of a mixture of liquid and gas from the interface region 28 between the liquid confinement structure 12 and the substrate W via the evacuation system hose 14. The operation of the gas seal and its ability to carry out its function without excessive disturbance to the liquid confinement structure 12, substrate W or immersion liquid, may depend on the quality of the gas flow in the seal 16 and therefore on the pumping performance of the evacuation system 30. According to the embodiment shown in FIG. 6 and further embodiments discussed below, a suitably stable and reliable performance may be provided through the use of a separator tank 35.

One way in which reliability may be achieved according to this approach is that a system based on a separator tank concept may be conceived with a minimal number of components. Additionally or alternatively, where embodiments are directed to use in a lithographic apparatus, for instance, it may be possible to make effective use of systems already available in such apparatus, such as a shared vacuum facility and a high pressure gas source, thus possibly minimizing costs and optimizing use of space. An additional or alternative advantage of a system based on a separator tank principle is that, for a broad range of viscosities, its operation may not be very dependent on the properties of the liquid being pumped. This could be in contrast to more complex liquid/gas pumping systems, which may be highly dependent on the flow properties of the mixture.

Additionally or alternatively, the use of a separator tank as a means to separate liquid and gaseous phases may offer an advantage from a noise perspective. Passive separation, as occurs in the separator tank under the influence of gravity, may reduce vibrational noise and heating, which might otherwise be transmitted through to the substrate or other imaging-critical element in such a way as to degrade the performance of the lithographic apparatus and/or transmitted to the environment around the apparatus so as to have a negative impact on that environment.

Additionally or alternatively, the internal components of the separator tank, and related components (such as those dedicated to draining the separator tank), rely on valves rather than pumps and so may confer an advantage in terms of reliability over liquid/gas processing systems that are based directly on pumps.

Other or alternative advantages may be discussed below in the context of one or more particular embodiments but should be understood as being more generally applicable where appropriate. In addition, although one or more embodiments are discussed in terms of liquid/gas mixtures removed from a gas seal in a lithographic apparatus, it should be understood that one or more embodiments of the invention may be applicable to other systems, lithographic or non-lithographic, involving removing a mixture of liquid and gas in a controlled manner. Such other systems may include, for example, the removal of a liquid/gas mixture from underneath the substrate during imaging in a lithographic apparatus.

According to an operating mode of the embodiment depicted in FIG. 6, the mixture of liquid and gas is drawn from the interface region 28 via evacuation system hose 14 to an opening in the upper region of the separator tank 35. The driving force for this movement of liquid and gas is a low pressure maintained in the separator tank 35. Liquid settles towards the bottom of the tank and gases are pushed to the top of the tank where they are largely removed by the pumping action of a separator tank pressure controller 40, which is configured to maintain a low pressure in the separator tank 35. Hose 31 links the separator tank pressure controller to the separator tank 35 via an opening in an upper surface 33. Positioning this opening near the upper surface 33 of the separator tank 35 helps prevent liquid making its way into the separator tank pressure controller 40. This arrangement can ensure that the separator tank pressure controller 40 and any pumping device associated therewith does not require a facility to deal with liquid, which may greatly simplify the task of providing a stable low pressure environment in the separator tank 35. The risk of system failure or unpredictable performance may be greatly reduced by protecting the separator tank pressure controller 40 from liquid in this way.

Positioning the link to the separator tank pressure controller 40 in an upper surface 33 of the separator tank 35 may help ensure that the liquid and gas separation process can proceed in an efficient manner. This separation process may also be improved by taking one or more steps to control (reduce) the flow rate of the liquid/gas mixture as it enters the separator tank, of gas as it is pumped away by the separator tank pressure controller 40, and/or of liquid as it is drained away into a purge tank 50. This may be achieved by providing large diameter hoses (which, in particular, may be arranged to increase in diameter near to the point of entry to the separator tank 35) and hose connections for respective links to and from the separator tank 35.

To allow for continuous operation, the separator tank 35 should be drained. In general, the separator tank 35 should not be allowed to fill excessively as a buffer volume is used to damp pressure fluctuations. The buffering/damping action decreases as the size of the buffer volume decreases because pressure fluctuations are only effectively damped by the gas content of the separator tank 35, the liquid content being highly incompressible. A liquid-filled separator tank 35 will provide little, if any, damping.

If the performance of the gas seal is not to be compromised, the draining of the separator tank 35 should avoid disturbing the separator tank pressure. Several arrangements may be used for this purpose. FIG. 6 depicts an embodiment using a purge tank 50, situated lower than the separator tank 35 and connected via an opening in its top surface 65 to an opening in the lower surface 55 of the separator tank 35. The actual height difference between the purge tank 50 and the separator tank 35 is not critical as long as there is some difference, so that gravity can be used to push liquid between the tanks 35 and 50. The connection between the tanks 35 and 50 can be controlled by a purge valve 70, which may be operable to be either open or closed or be arranged to let liquid flow only in one direction (i.e. by using a "check valve").

According to an embodiment, a pressure equalization connection 75 may be provided between an upper region of the purge tank 50 and an upper region of the separator tank 35, controlled by a pressure equalization valve 80. In normal operation, the purge valve 70 will be left open and liquid will drain from the separator tank 35 into the purge tank 50. The volume occupied by liquid, and therefore the remaining volume in each of the tanks may change, which will affect the pressures in the tanks. For example, in the case where the liquid level is going down in the separator tank 35 and up in the purge tank 50, the pressure will tend to decrease in the separator tank 35 and increase in the purge tank 50. The change in pressure in the separator tank 35 may compromise the stability of the low pressure provided by the separator tank pressure controller 40, which in turn may negatively affect the performance of the gas seal. On the other hand, the increase in pressure in the purge tank 50 may act as a cushion to liquid entering from the separator tank 35 and reduce the efficiency with which the separator tank 35 is drained. The pressure equalization connection 75 may be provided to equalize the pressures in the two tanks 35 and 50 and thus largely eliminate the above possible concerns. Alternatively, a connection may be provided to maintain a fixed pressure difference between the separator tank 35 and the purge tank 50. By establishing a slightly higher working pressure in the purge tank 50, for example, it may require less time to pump down the purge tank 50 after an emptying procedure (see below for a further description). A balance should be struck between the time saved during such a pump down phase and any reduction in the efficiency of draining of the separator tank caused by a higher pressure in the purge tank 50. As a further variation, the same separator tank may be used as part of an evacuation system for a plurality of sources of liquid/gas mixtures. Alternatively or additionally, a number of separator tanks 35 (perhaps maintained at different pressures) may be connected to the same purge tank 50. In this arrangement, where the separator tanks 35 are at different pressures, it may be convenient to choose to maintain the purge tank at an intermediate pressure. Additional valves may be included to isolate one or more of the purge tanks from each other in order to eliminate cross-talk between the tanks. This arrangement may reduce or remove the need for an intermediate pressure being maintained in the purge tank 50.

The purge tank 50 may be emptied to a liquid sink 90 via a liquid sink valve 95. The liquid sink 90 may be a drain or be connected to a liquid recycling system. Emptying of the purge tank 50 may be initiated when the liquid level in the tank exceeds a predetermined threshold value. This may in turn be determined based on timing (i.e. a controller may be programmed to initiate a purge tank emptying procedure after a given time has elapsed after the completion of a previous emptying procedure, the given time being selected by reference to calibration measurements carried out to determine a purge tank fill-rate under standard conditions), or a liquid level sensor 52 may be provided that is configured to measure the liquid level and report to a controller when the liquid level reaches a threshold level. The liquid level sensor 52 may be a kind of float sensor, for example. The option of using a controller in conjunction with a sensor can provide for flexible operation, allowing the apparatus to adapt seamlessly to a change in operating conditions, such as a variation in the rate of liquid flowing into the evacuation system. On the other hand, the option of controlling the evacuation system solely on the basis of a timed cycle makes it possible to reduce the number of sensors (only emergency sensors may need to be included) and omit expensive control circuitry. By reducing the number of critical components in this way, it may be possible to keep costs low while achieving sufficient reliability. Where the liquid flow rate is variable and it is desired to use a timed cycle arrangement, the timed cycle can be set to allow for a maximum flow rate, all flow rates less than this being provided for automatically.

Emptying the purge tank 50 may be carried out by closing any gas connections between the separator tank 35 and the purge tank 50 (via the pressure equalization valve 80 for example where it is provided), closing the purge valve 70, and then opening the liquid sink valve 95. A high pressure gas source 100 may be connected to the upper region of the purge tank 50 in order to establish a high gas pressure in this region and force liquid more quickly from the purge tank 50 into the liquid sink 90. The pressure in this region may be controlled via valve 101. However, if the speed of draining of the purge tank 50 is not critical then the high pressure gas source 100 may be omitted. Once the purge tank has been emptied, the liquid sink valve 95 may be closed again. However, resuming normal operation immediately by opening the pressure equalization connection 75 would normally cause an excessively large gas flow from the purge tank 50 to the separator tank 35, which may cause pressure fluctuations in the separator tank 35. This gas flow typically arises due to the pressure difference between the two tanks 35 and 50 (which may be exacerbated in the case that the purge tank 50 is larger than the separator tank 35). Providing a limited flow connection 145, comprising a flow restriction device 150, between the two tanks 35 and 50, may reduce the size of the gas flow. This restricted connection allows the purge tank 50 to be gradually pumped down to the same pressure as the separator tank 35 without unduly loading the separator tank pressure controller 40 by a sudden influx of gas. The limited flow connection 145 may be provided as a separate connection (as depicted in FIG. 6) or may alternatively be implemented via the pressure equalization connection 75 (for example, by providing a controllable valve 80 that is capable of providing a low flow impedance for normal operation (when the purge tank 50 is already pumped down), and a high flow impedance during a phase where the purge tank 50 is being gradually pumped down after an emptying procedure). In applications where the flow restriction device 150 may be set to have a relatively low flow impedance, it may be possible to dispense with the pressure equalization connection 75 altogether and use the flow restriction device 150 as a means to gradually pump down the purge tank 50 and to ease the flow of liquid between the two tanks 35 and 50. The flow restriction device 150 may be, for example, a needle valve, orifice or capillary tube. The size of the constrained opening used may be in the range of 10 μm to 2 mm.

The flow impedance to choose for the flow restriction device 150 will depend on a number of factors, including the pressure used by the high pressure gas source 100, the volumes of the purge and separator tanks 35 and 50, the pumping power of the separator tank pressure controller 40, and the maximum tolerable increase in pressure that is to be allowed in the separator tank 35. Calibration measurements may be used to determine an appropriate flow restriction and/or the flow restriction device 150 may be configured to be adjustable so as to respond to different operating conditions. Additionally, the flow restriction device may be controlled by a flow rate controller that provides feedback correction based on the pressure in the separator tank 35 (as measured by a separator tank pressure sensor 32). For example, when it is sensed that the pressure in the separator tank 35 has exceeded, or will exceed, a threshold, the controller may be configured to send a signal to the flow restriction device 150 to stem the flow of gas into the separator tank 35 (by increasing its flow impedance). In general, the time to equalize pressures in the separator and purge tanks 35 and 50 will be a major contributor to the overall cycle time. Faster equalization may be achieved by providing an additional high-throughput connection to the purge tank 50 that allows independent and rapid pumping of this volume.

In case the emptying procedure is not well regulated or some other malfunction occurs, the separator tank 35 may be fitted with a sensor 32 to measure the liquid level in the tank. If the liquid level rises beyond a predefined "maximum fill level" (which will be chosen to be safely below the level of the entry point for the separator tank pressure controller 40), the evacuation system may be configured to enter a safety mode. The safety mode may comprise at least the function of isolating the separator tank pressure controller 40 from the separator tank 35 so as to prevent damage to the separator tank pressure controller 40.

In general, the separator tank 35 may be arranged to have a volume of between 1 and 10 liters with the purge tank 50 being arranged to be much larger. For a separator tank 35 much smaller than 1 liter, it may be difficult to maintain a stable pressure and emptying would have to be carried out more frequently. On the other hand, a separator tank 35 much larger than 10 liters may be considered too cumbersome and may place too great a load on the separator tank pressure controller 40.

The control of the flow rate of liquid and gas into the separator tank 35 is also affected by the size of the separator tank 35 (and therefore any residual or buffer volume in the separator tank 35). A large buffer volume means that a greater quantity of gas will need to be provided or removed by the separator tank pressure controller 40 in order for it to manipulate the pressure in the buffer volume and thus the flow rate, making it more difficult for the separator tank pressure controller 40 to carry out its function.

Figure 7:
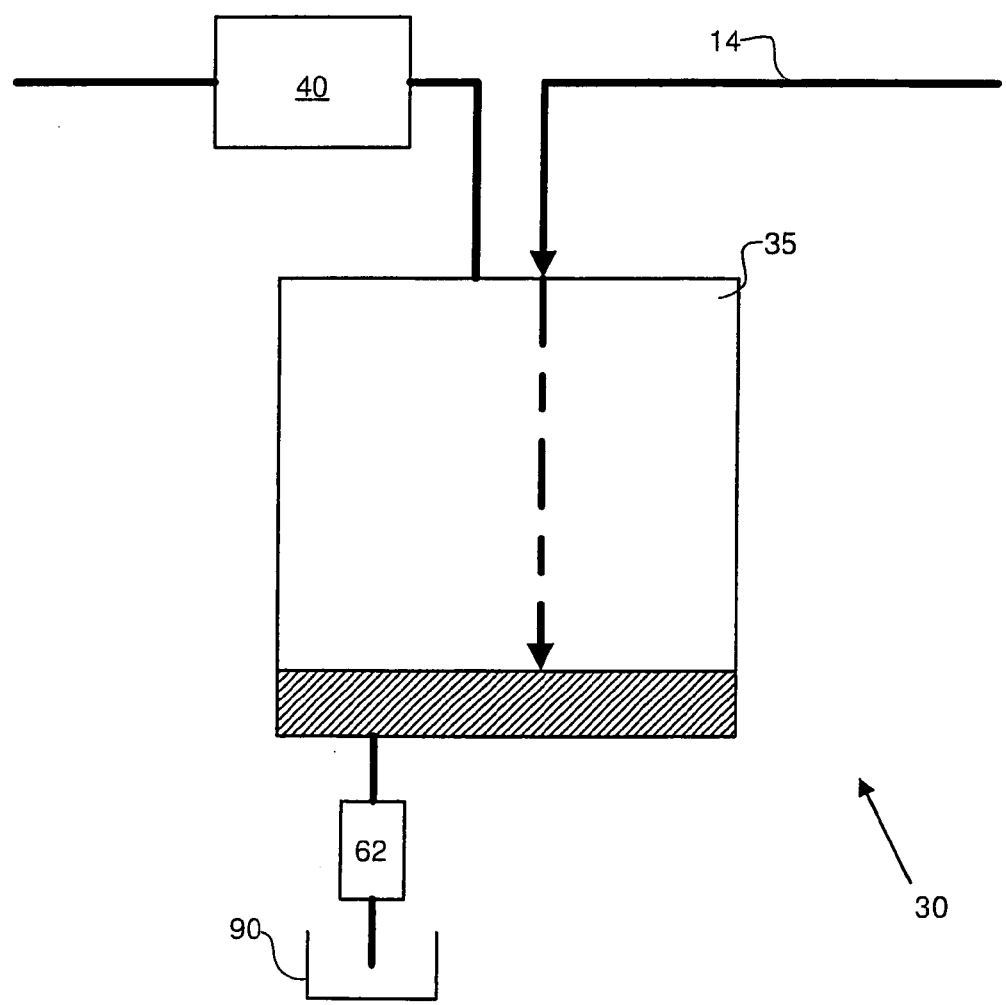
FIG. 7 depicts an evacuation system according to an embodiment of the invention, the system comprising a separator tank only.

As a simpler alternative to the embodiment depicted in FIG. 6, the liquid level in the separator tank 35 may be controlled without a purge tank by pumping directly on the liquid in the separator tank 35 via a liquid or two-phase compatible pump 62 connected to a suitable valve in the lower region of the separator tank 35, as depicted in FIG. 7. According to this arrangement, however, steps may need to be taken to ensure that pressure fluctuations in the pump 62 do not disturb the quality of the low pressure state maintained in the separator tank 35 by the separator tank pressure controller 40.

Due to the expense and space required for multiple vacuum sources, it is often convenient where a number of different apparatuses require such sources to provide a shared vacuum facility (a "house vacuum"). In the embodiments discussed above with reference to FIGS. 6 and 7, for example, a share vacuum facility may be used as the basis for the separator tank pressure controller 40. The use of a single vacuum facility for several apparatuses has a number of advantages in terms of space-saving and costs, but it may also suffer one or more drawbacks. For example, it may often be necessary to provide an effective and reliable gas-liquid separation system, since liquid will not normally be tolerated in the shared vacuum facility. First, because the shared vacuum facility provides low pressure to various different users in the plant, some of these users may require a certain minimum in terms of stability of the vacuum. Liquid in the shared vacuum facility will essentially form a 2-phase flow, which is typically unstable. Thus, the ingress of liquid into the shared vacuum facility may negatively affect other users. Additionally or alternatively, it is likely that the shared vacuum facility will not have been designed for moisture. There may be no precautions against corrosion, electrical shorts etc. Consequently, the shared vacuum facility may forbid users from releasing moisture into the shared vacuum facility.

A gas-liquid separation system may be complex, bulky, prone to serious failure with unacceptable consequences and relatively expensive. Furthermore, the performance of such a system may be generally unsuitable for the present application. For example, the liquid/gas mixture could in principle be extracted by direct connection to a liquid-ring pump without any other hardware in between. The performance of such a system may be inferior to one or more embodiments of the present invention in terms of stability, pulsations, etc., although it may be possible to extract most of the liquid in this way.

Furthermore, reliance on a shared vacuum facility makes this component a single-point-failure for all of the apparatuses dependent on it: a single failure in the shared vacuum facility may lead to failure and/or damage in a large number of separate apparatuses.

According to one or more embodiments of the present invention, an evacuation system 30 is provided that comprises a two-phase compatible pump (e.g. a liquid ring pump, or a liquid jet pump) as the main driving force to extract the gas/liquid mixture, in combination with the shared vacuum facility as a backup in case the two-phase compatible pump fails and apparatus damage may be caused due to leakage of the liquid from the liquid confinement structure 12. According to this embodiment, therefore, failure of the shared vacuum facility may not necessarily lead to failure of a large number of apparatuses and no gas/liquid separation mechanism may be required.

Figure 8:
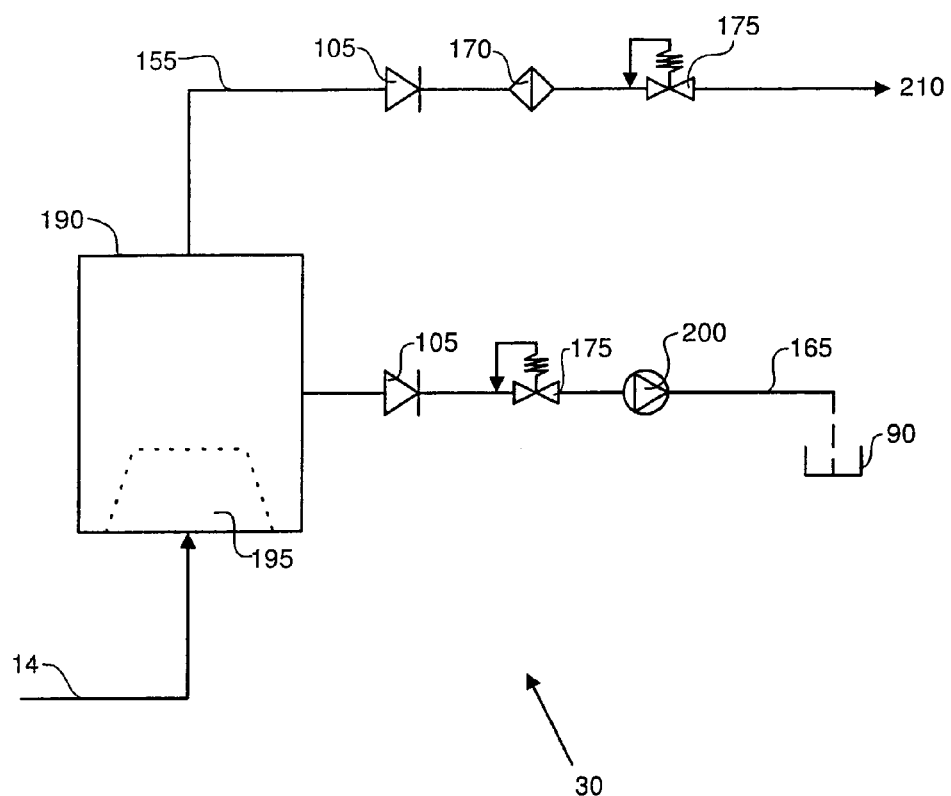
FIG. 8 depicts an evacuation system according to an embodiment of the invention, the system comprising a liquid/gas homogenizer and a holding tank arranged to be pumped down by a two-phase compatible pump backed up by a shared vacuum facility.

FIG. 8 shows an embodiment comprising a two-phase compatible pump 200 in combination with a shared vacuum facility 210. The gas/liquid mixture is drawn via hose 14 as before and enters a holding tank 190 through a porous block 195 located at the bottom of the tank. Pore sizes in the micron range are generally well suited to the application in hand although in extreme cases it may be possible to include pore sizes up to several hundred microns. The porous block may be formed from a sintered material designed, for example, for particle filtering. Materials such as stainless steel 316L, Hastelloy C-22, or nickel may be used, nickel being well suited for dealing with ultra-pure water. The types of material likely to be suitable are those that may also be used as a flow restrictor for gases and/or liquids or as a "gas diffuser", which may be used to reduce the velocity of a purge gas to ensure uniform and laminar flow. Alternatively, the porous block 195 may be formed using electrochemical processes, or may be formed using non-metallic materials.

The porous block 195 acts to homogenize the mixture of gas and liquid by creating a uniform suspension of fine gas bubbles in the liquid. The uniform mixture thus obtained has more constant and predictable flow characteristics and can be more easily dealt with by the two-phase compatible pump 200, which extracts the majority of the liquid/gas mixture via a main pumping line 165. If the mixture were not uniform, slug flow would result in the outflow of the holding tank 190 leading to erratic flow and, therefore, unstable pressure.

The shared vacuum facility 210 provides a backup pumping capability via backup line 155. As shown in FIG. 8, the outlet for the backup line 155 should be towards an upper surface of the holding tank 190 so that, should the main pumping line 165 fail, the evacuation system 30 will continue to operate via the backup line 155. In this scenario, the liquid part of the gas/liquid mixture would no longer be pumped out of the holding tank 190 but would rather start to settle at the bottom of the tank. The backup capacity of the tank 190 should be such as to allow all the liquid confined by the liquid confinement structure to be removed following a pump failure in order to prevent leakage (the liquid supply system would typically be shut off).

The shared vacuum facility 210 may be protected from liquid through the use of a hydrophobic filter 170 on the backup line 155. The hydrophobic filter acts to allow gas (even humid gas) to pass but blocks the flow of liquid. A strained Teflon membrane may be suitable for this purpose, a device of this type being available in the field for use as a particle filter. The basic structure of this membrane is that of an intertwined network of Teflon strands, resembling "spaghetti". The use of this membrane as a hydrophobic filter is based on a side-effect whereby liquid causes the Teflon strands to swell up and block the gas/liquid flow, whereas pure gas flows (including humid gas) are allowed to pass. However, any other material having the property of blocking the flow of liquid but allowing gas to pass could also be used. An advantage of this type of filter is that it is simple and reliable in comparison to alternative mechanisms that serve the same purpose (for example, a device configured to detect droplets in a gas stream and close a valve when droplets are detected, would require a considerably more complex arrangement that is likely to be more expensive to implement and may have inferior reliability).

During normal operation, the main pumping line 165 should be configured to provide a deeper vacuum than the backup line 155 so that the majority of the gas/liquid mixture passes through the main pumping line 165. A check valve 105 may be provided on each line to ensure that they do not draw on each other. In addition, a backpressure regulator 175 may be provided on each line to avoid unnecessarily burdening the shared vacuum facility 210 with work when it is not actually needed. The backpressure regulator 175 in backup line 155 will be set at a lower vacuum (i.e. a higher pressure level) than provided by the shared vacuum facility 210. Thus, in normal operation, the shared vacuum facility 210 will not draw on the system. Only when the pump 200 fails and the pressure in the holding tank 190 starts to rise, does the backpressure regulator open up and allow the shared vacuum facility 210 to draw on the holding tank 190.

Figure 9:
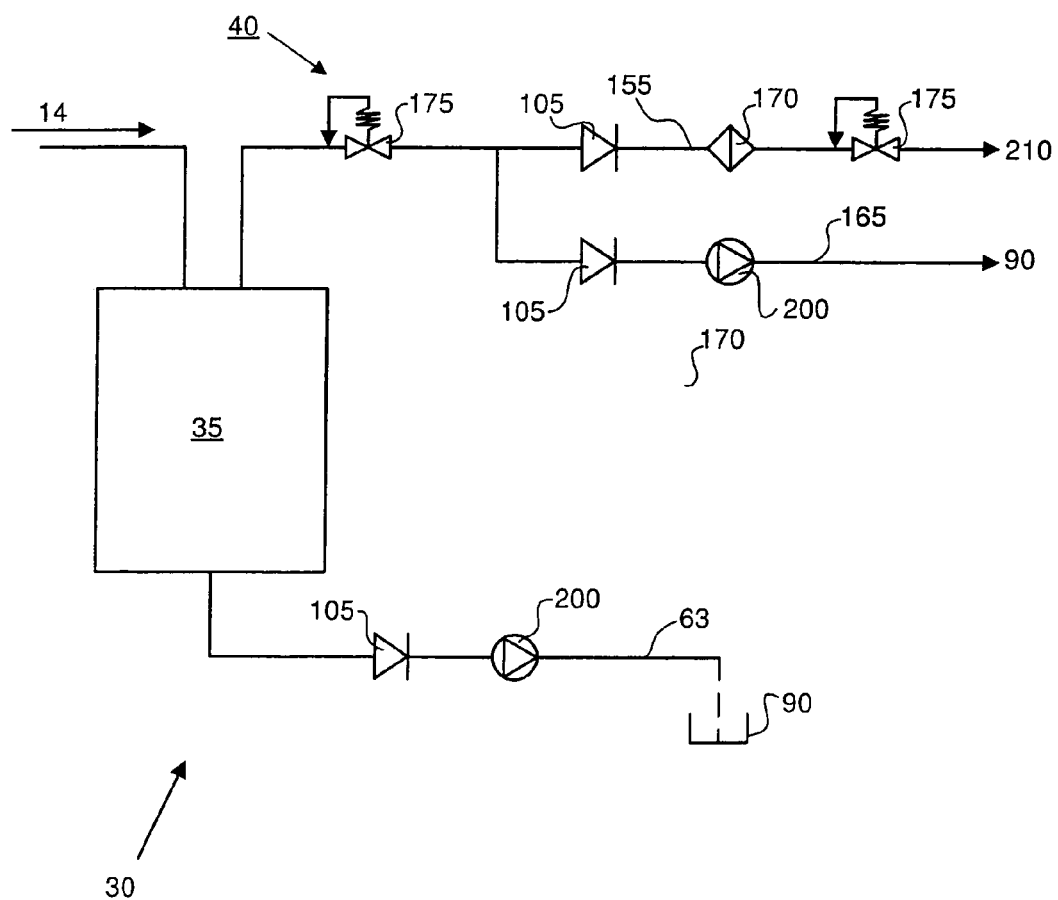
FIG. 9 depicts an evacuation system according to an embodiment of the invention, the system comprising a separator tank arranged to be pumped down by a two-phase compatible pump backed up by a shared vacuum facility.

FIG. 9 shows an evacuation system 30 with a separator tank 35 in a similar configuration to FIG. 7. According to the arrangement shown in FIG. 9, however, the separator tank pressure controller 40 comprises a main pumping line 165 and a backup line 155. The main pumping line 165 is configured to provide a deeper vacuum than the backup line 155 and a hydrophobic filter 170, a check valve 105 and a back pressure regulator 175 may be provided in each line to perform the functions as discussed above in relation to FIG. 8. As for the embodiment in FIG. 7, the separator tank 35 can be emptied using a liquid pump 200. A check valve 105 may be provided on the separator tank pumping line 63 to ensure that no backflow occurs from the liquid sink 90.

Figure 10:
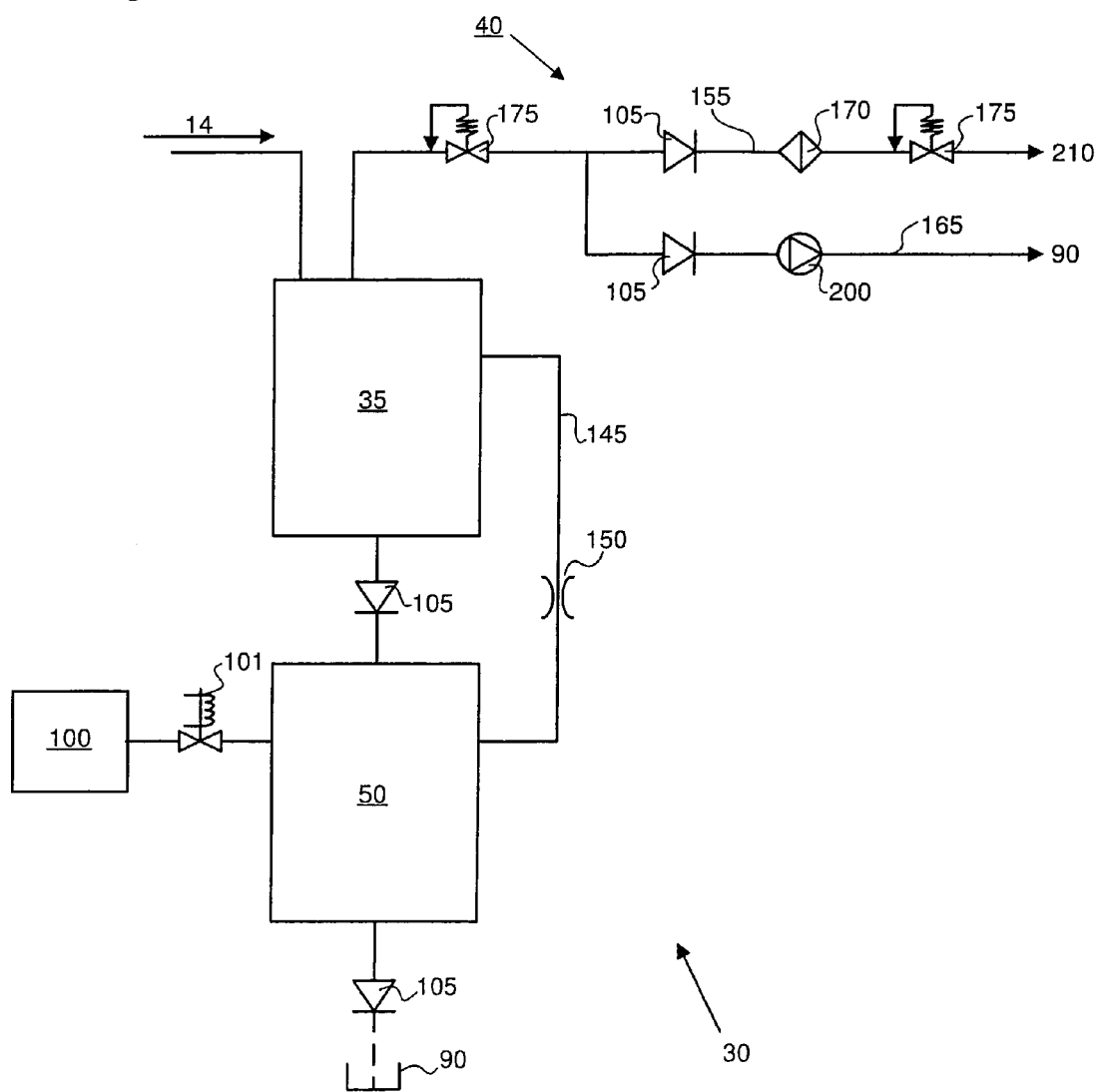
FIG. 10 depicts an evacuation system according to an embodiment of the invention, the system comprising a separator tank and a purge tank, the separator tank being arranged to be pumped down by a two-phase compatible pump backed up by a shared vacuum facility, and the separator tank and purge tank being connected together by a limited flow connection.

FIG. 10 shows an embodiment comprising two tanks—a separator tank 35 and a purge tank 50—in a similar configuration to the embodiment described above with reference to FIG. 6. Here again, however, the separator tank pressure controller 40 comprises a main pumping line 165 and a backup line 155, with the main pumping line 165 being configured to provide a deeper vacuum than the backup line 155. In addition, check valves 105 have replaced the valves 70 and 95 of FIG. 6. This configuration may reduce the need for system control (either manual or automatic) and may improve system reliability by reducing the possibility of error. The check valve 105 located between the tanks 35 and 50 allows liquid to flow from the separator tank 35 into the purge tank 50 under normal operation but closes off during a purge tank 50 emptying procedure, during which the pressure in the purge tank 50 may temporarily rise above that in the separator tank 35. The check valve 105 between the purge tank 50 and the liquid sink 90 ensures that a vacuum can arise in the purge tank 50 without drawing material back from the liquid sink 90. Again, a limited flow connection 145 comprising a flow restriction device 150 can be used to effect pressure equalization between the two tanks 35 and 50 in a gradual manner so as not to disrupt the pressure maintained in the separator tank 35.

The embodiment shown in FIG. 10 and analogous embodiments involving check valves rather than active valves, which ensure that flow occurs only in the desired direction without the need for a control system to apply timing valve actuation, etc., may be operated in a continuous "one state" mode, without, for example, having to switch periodically from a normal operating state to a "purge tank emptying state". In the embodiment shown in FIG. 10, this is achievable by controlling the rate of flow to and from the purge and separator tanks so that neither becomes overly full. An advantage of this type of arrangement may be increased reliability as no valves will need to switch regularly and no timing actuation will need to take place. If it is desired to increase the rate at which liquid is drained from the purge tank 50, an upper region of the purge tank 50 may be connected to a high pressure gas source 100 via valve 101 as described above in relation to the embodiment depicted in FIG. 6.

Figure 11:
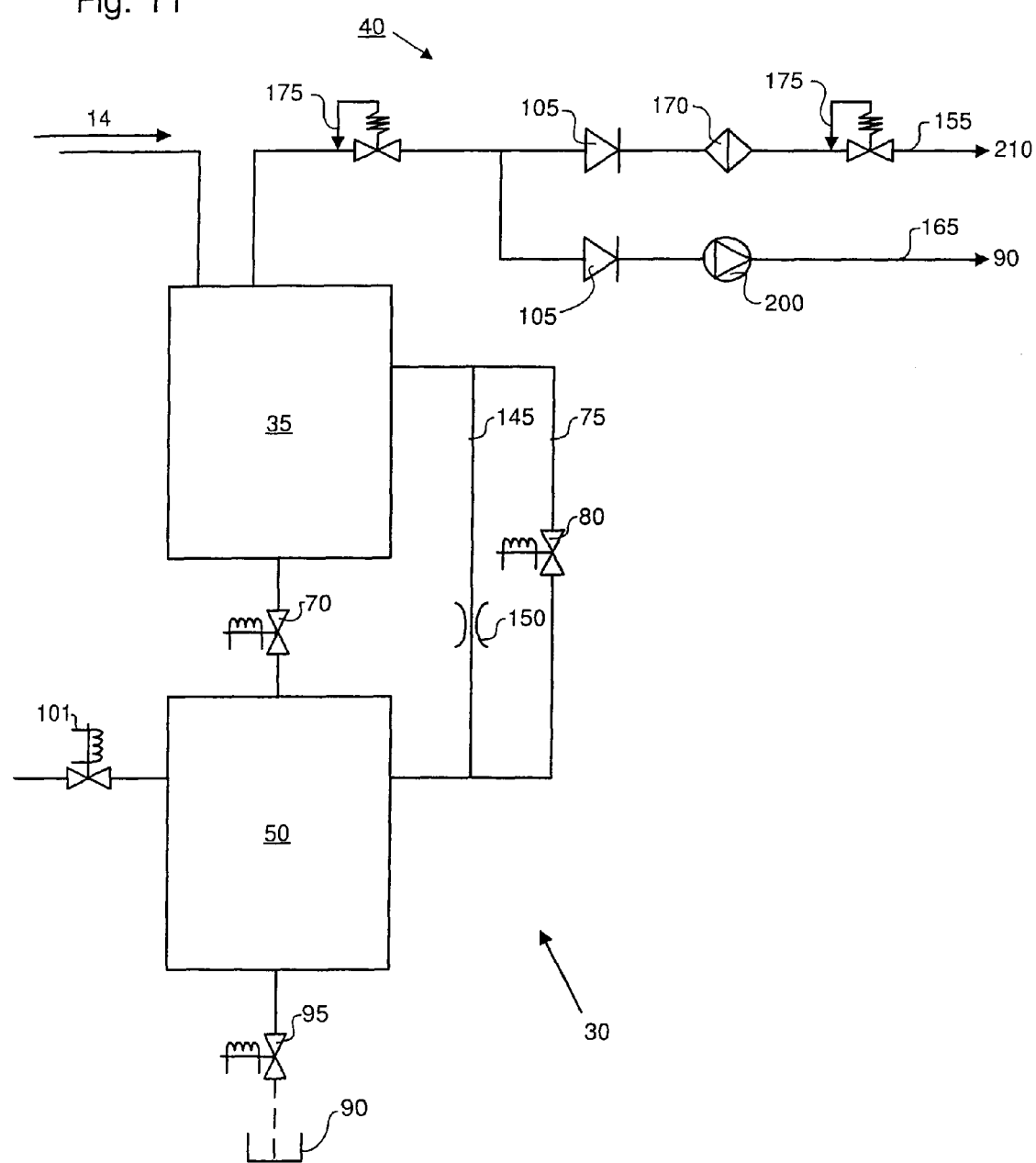
FIG. 11 depicts an evacuation system according to that shown in FIG. 10 but further comprising a pressure equalization connection between the separator and purge tanks.

FIG. 11 shows an alternative arrangement to that shown in FIG. 10, wherein the check valves 105 have been replaced by active valves, which can be opened or closed for flow in either or both directions (automatically or manually). The arrangement corresponds closely to that shown in FIG. 6 except that the separator tank pressure controller 40 has been expanded to show a specific configuration, including a main pumping line 165 backed up by a backup line 155 in a similar manner to those embodiments discussed above that include main pumping and backup lines 165 and 155.

Figure 12:
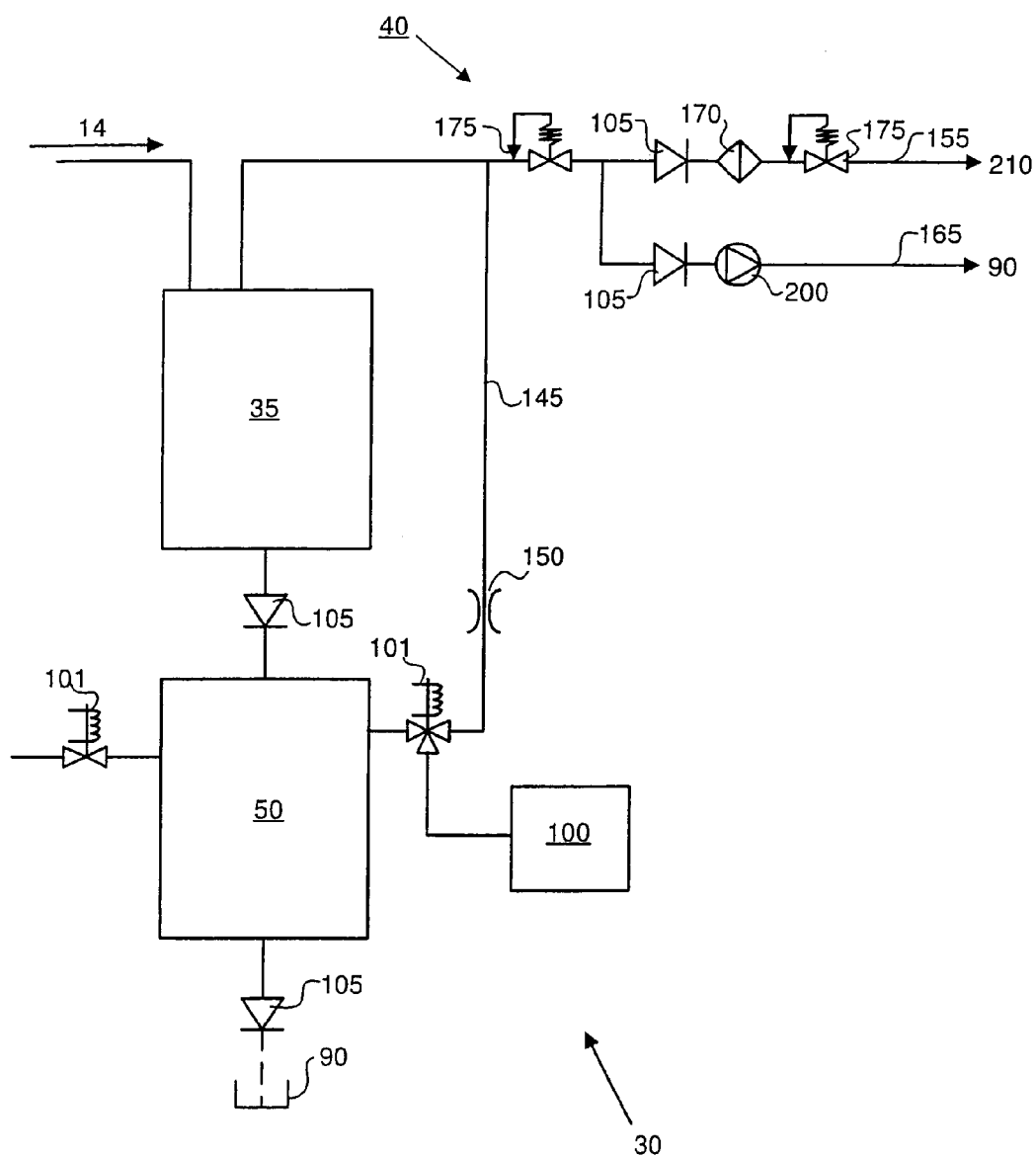
FIG. 12 depicts an evacuation system according to that shown in FIG. 10 but further comprising a connection between the purge tank and the two-phase compatible pump and shared vacuum facility.

FIG. 12 shows an alternative to the arrangement shown in FIG. 10, in which the high pressure gas source 100 is connected to the purge tank 50 via a same valve as the limited flow connection 145, which in turn is connected directly to the line feeding the main pumping and backup lines 165 and 155. This arrangement operates in an analogous manner to the embodiment described above with reference to FIG. 10, but may be implemented with fewer components and fewer connections to the purge and/or separator tanks. Valves 101 can be actively actuated and used to control the emptying sequence of the purge tank 50. Actuation of valves 101 can be effected electrically or pneumatically, for example.

Figure 13:
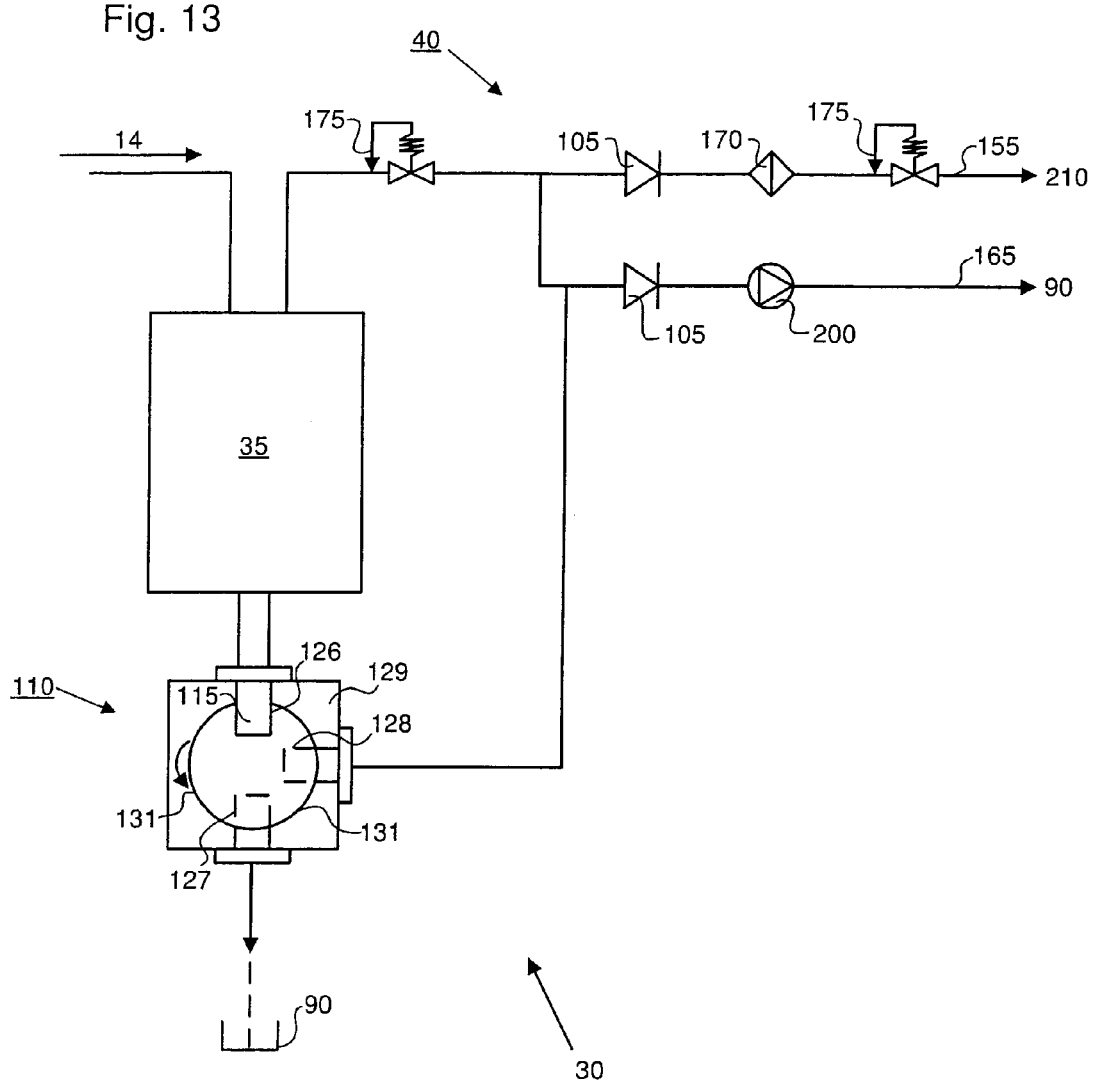
FIG. 13 depicts an evacuation system according to an embodiment of the invention, the system comprising a separator tank only with a rotating wheel liquid pump arranged to drain the liquid from the separator tank.

FIG. 13 depicts an embodiment of the invention that is analogous to that discussed above in relation to FIG. 7, the embodiment differing in the choice of pump used to drain the separator tank 35. According to this embodiment, the liquid pump 62 comprises a wheel 110 with one or more cavities 115 connecting with the circumferential surface of the wheel 110 so as to provide one or more circumferential openings. The wheel operates to remove liquid from the separator tank as follows. For a given cavity 115 and associated circumferential opening, three operating positions (or regimes) exist, each corresponding to different angular positions of the wheel 110 (or ranges of angular position): a liquid filling position 126, a liquid purging position 127 and a gas purging position 128. When the wheel rotates so that a particular cavity 115 is in the liquid filling position 126, that cavity is connected to an opening in the separator tank 35 and liquid from the tank flows downwards under gravity into the cavity 115 until the cavity is full. The flow of liquid downwards may tend to reduce the pressure in the separator tank 35, but if the volume of the cavities 115 are small enough and/or the separator tank pressure controller 40 is configured to respond quickly enough (by adjusting its pumping power) then the pressure fluctuation in the separator tank 35 may be kept within acceptable limits. The wheel 110 will eventually rotate the cavity 115 away from the filling position 126, the cavity becoming temporarily sealed against a wheel housing 129 when the trailing edge of the circumferential opening for the cavity 115 moves past the opening in the separator tank 35. The cavity 115 may remain sealed until the wheel rotation brings the cavity 115 into the liquid purging position 127, wherein the cavity is connected to a liquid sink 90. Most of the liquid stored in the cavity will leave at this point to be replaced by gas (this may be provided by a separate gas supply or be taken from a gas-filled volume within the liquid sink). The cavity 115 is then rotated away from the liquid purging position 127, again becoming temporarily sealed against the wheel housing 129 before arriving at the gas purging position 128. At this position, the cavity 115 is pumped down by a two-phase compatible pump (which in the embodiment shown is achieved via a connection to the main pumping line 165) to prepare for the influx liquid that will occur when wheel 110 is made to complete the 360° rotation back to the liquid filling position 126.

The wheel 110 may be configured to rotate in a discontinuous manner so as to wait for a predetermined period, for example, at one or more of the three positions to give sufficient time for the process concerned to be carried out. Alternatively, the wheel 110 may be rotated continuously with the angular velocity chosen as a function of the width of the separator tank, liquid sink, pump and cavity openings so that enough time is available for the purging and/or filling operations to be carried out efficiently. Other effects such as turbulence in the separator tank 35 and/or undesirably large pressure fluctuations may occur for excessive angular velocities. A sliding seal may be used to seal the cavity at intermediate positions 131. Although the embodiment shown has only a single cavity, the wheel 110 may also operate with a plurality of cavities, so that at any given time different cavities may be exposed to two or more of the three operating positions 126, 127 and 128. This type of liquid pump has an advantage that it may be used continuously, which minimizes the risk of pressure fluctuations during an emptying phase (such as may be the case where a purge tank is used). The simplicity of the mechanism may provide high reliability and, because it is relatively insensitive to variations in the flow properties of the liquid, it is unlikely to suffer from the pressure fluctuations to which a traditional liquid pump may be prone.

Figure 14:
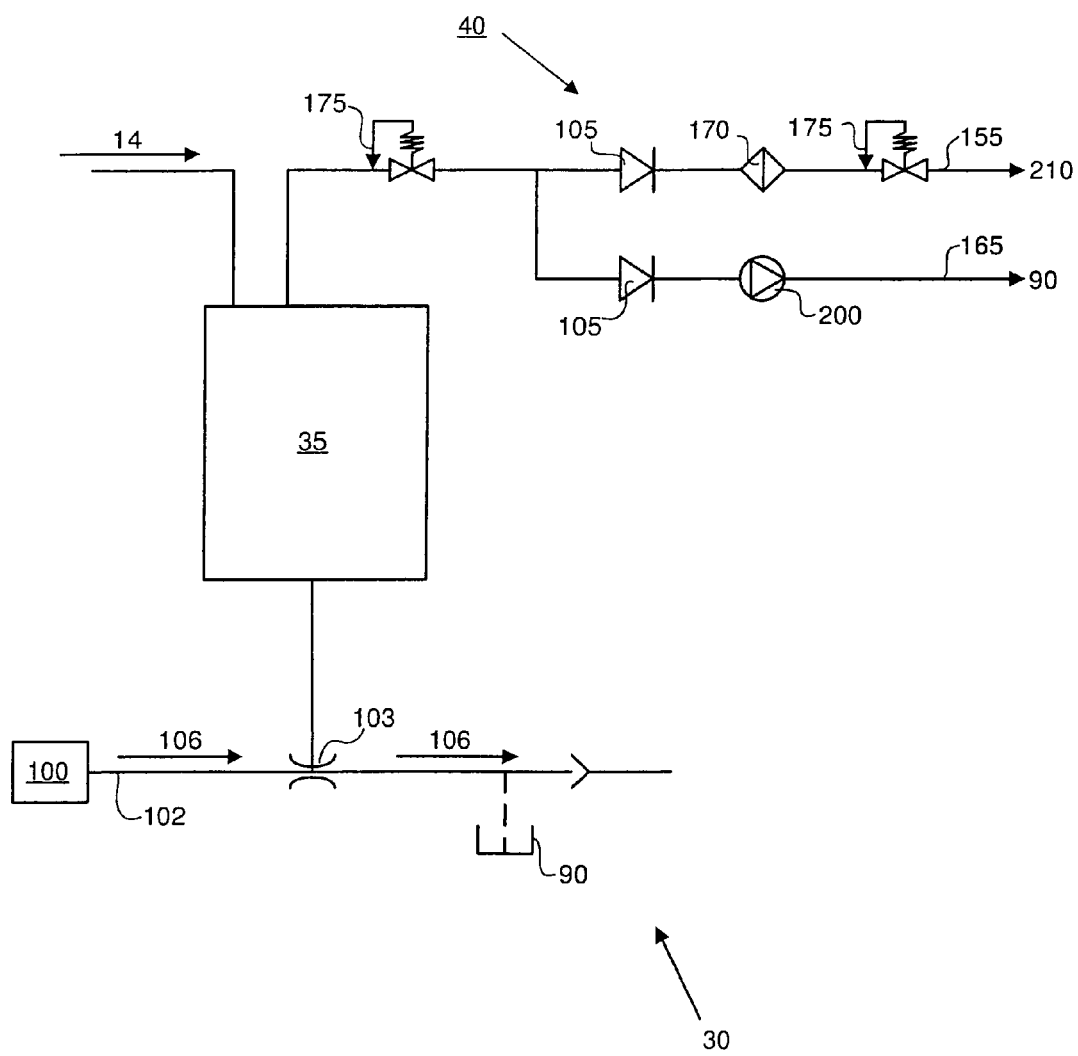
FIG. 14 depicts an evacuation system such as that shown in FIG. 13, except that a gas jet pump is arranged to remove liquid from the separator tank.

FIG. 14 depicts an alternative pump 62 in a configuration analogous to that depicted in FIGS. 7 and 13. Here, a gas jet pump is provided to remove liquid from the separator tank 35. A stream of high velocity gas (a "gas jet") is forced to flow along duct 102, from left to right in the Figure (arrows 106), by a high pressure gas source 100 (which may be the same as that used to supply the gas seal, for example). An outlet from the separator tank 35 is connected substantially at right angles to a venturi nozzle 103, through which the gas jet flows. The venturi nozzle 103 constricts the flow, leading to an increase in particle speed and a corresponding reduction in pressure. It is this reduction in pressure that provides the low pressure to extract the liquid from the separator tank 35. Again, this arrangement may work continuously and can be arranged to provide a highly controllable pumping power. Due to the relatively simple construction and the fact that it can be operated using features (the high pressure gas source 100) that are already provided in a lithographic apparatus, this liquid pump designs offers a possibly cost effective and space-saving solution. The lack of moving parts means that it may be made to be extremely reliable.

An analogous pump to the gas jet pump can be realized using a liquid jet instead of the gas jet. This may be preferred as the underlying mechanism for this type of pump is momentum transfer, and a liquid, such as water, is likely better at that than gas due to its higher specific mass. Moreover, it may be much more robust against pressure fluctuations which are a phenomenon in two-phase flows.

Figure 15:
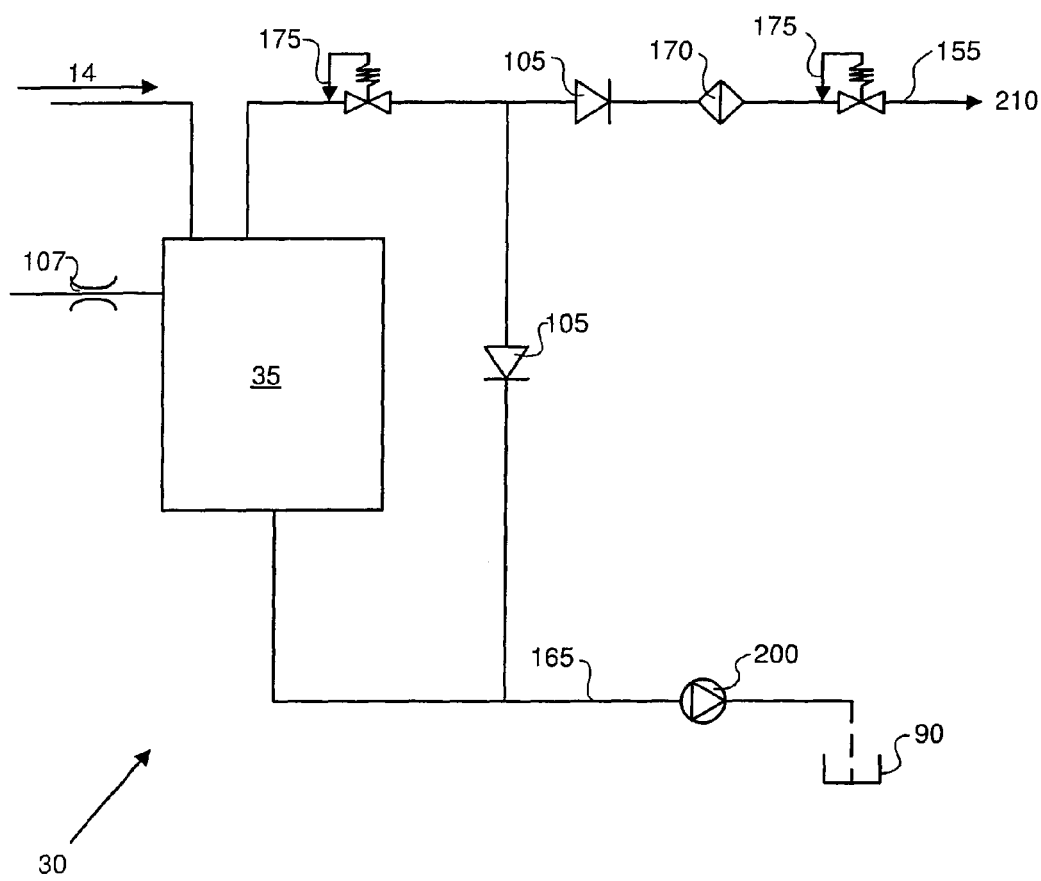
FIG. 15 depicts an evacuation system according to an embodiment of the invention, the system comprising a separator tank only with a two-phase compatible pump being configured to drain liquid from the separator tank and maintain a stable pressure in the separator tank, and with a check valve positioned between the pumping line configured to drain the separator tank and the pumping line configured to maintain the pressure in the non-liquid-filled region of the separator tank.

FIG. 15 depicts a further embodiment based on the separator tank concept. In the arrangement shown, a single two-phase compatible pump 200 is used both to extract liquid from the lower portion of the separator tank 35 and to provide the main pumping power for the low pressure region in the separator tank 35. As before, a backup line 155 is provided, which may be linked to a standard gas pumping system such as a shared vacuum facility 210. A check valve 105 is located as shown between the main pumping line 165 and the backup line 155 to ensure that the shared vacuum facility 210 does not pump any liquid from the separator tank 35. An advantage of this arrangement is reduction in the number of components to implement the separator tank concept by using a single pump to pump out both the liquid and gaseous regions of the separator tank 35. A flow restriction 107 may be provided that, for a given flow-rate, maintains the pressure inside the separator tank 35 at a fixed offset relative to ambient pressure. This serves as an alternative to a pressure regulator—if or when the flow 14 pulsates, the flow through the flow restriction 107 will compensate the pressure pulsations in the separator tank 35.

Figure 16:
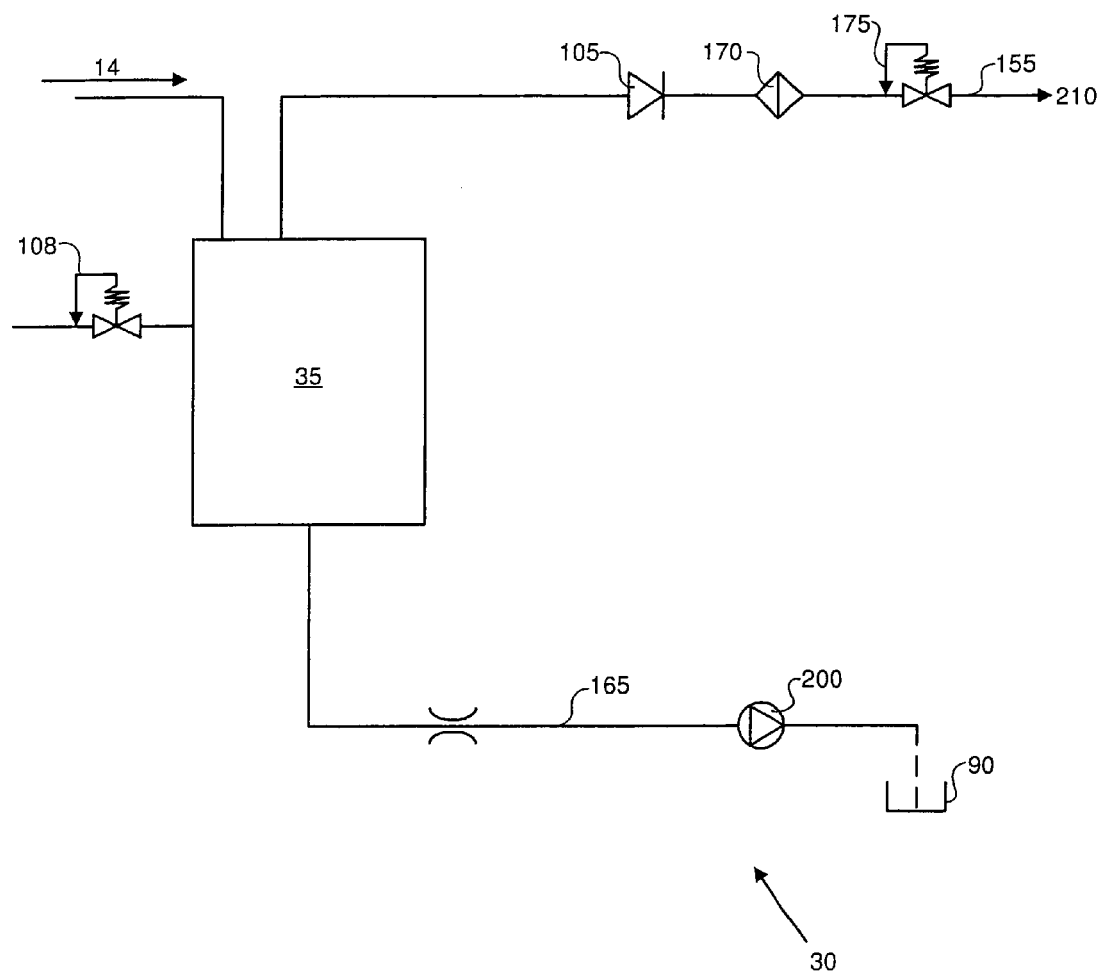
FIG. 16 depicts an evacuation system according to that shown in FIG. 15 without the check valve.

FIG. 16 is an alternative embodiment to that described above with reference to FIG. 15, differing in that the single pump 200 used to pump down the gaseous region of the separator tank 35 and to remove the liquid therefrom is arranged only to remove liquid. Pressure stability in the tank is provided by pressure regulator 108 and gas that has been separated from the liquid is removed via line 155. The pressure regulator 108 maintains the pressure in the separator tank 35 at a constant level by adding a pressure dependent flow, in effect acting to compensate for flow fluctuations in the line 155. This arrangement may provide an evacuation system with a smaller number of components, thus possibly providing increased reliability and cost effectiveness.

Figure 17:
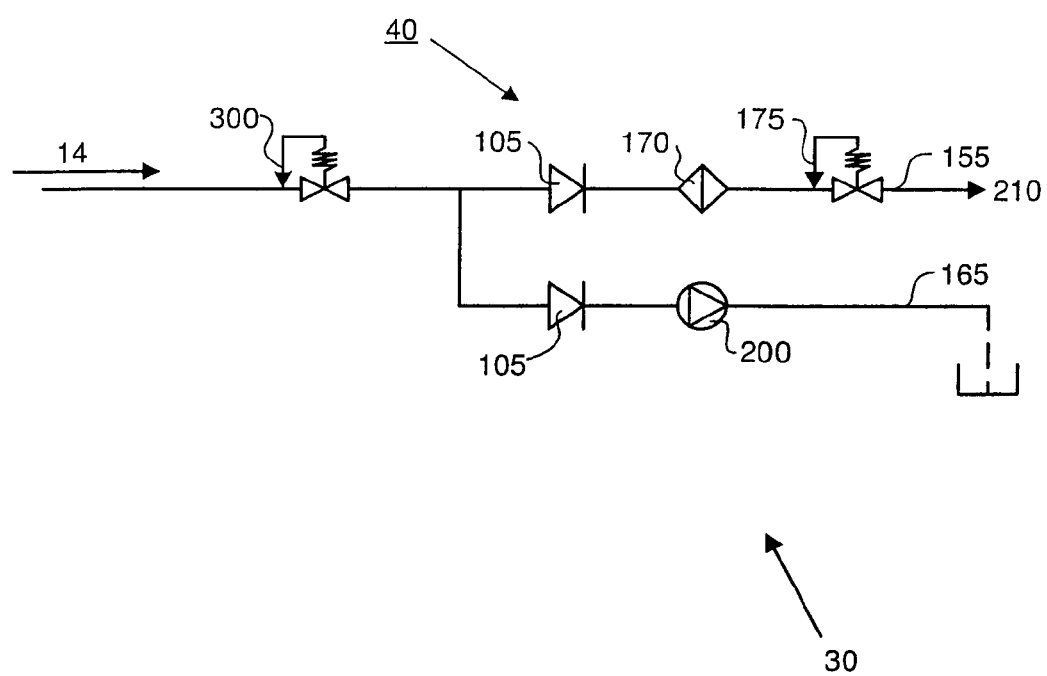
FIG. 17 depicts an evacuation system according to an embodiment of the invention, the system comprising a two-phase compatible pump backed up by a shared vacuum facility and controlled by a two-phase compatible vacuum pressure regulator.

The concept of a main pumping line 165, capable of dealing with liquid and gas, working in combination with a backup line 155, based on gas extraction only, may also be implemented in an evacuation system 30 that does not comprise any separator tank 35 or holding tank 50. Instead a "straight-through" pump concept may be employed as is depicted in FIG. 17. Pressure stability/regulation is taken care of according to this embodiment through the use of a two-phase-compatible pressure regulator 300.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An evacuation system configured to provide controlled removal of a mixture of liquid and gas from a region, the system comprising:
   a separator tank arranged to separate liquid from gas in the mixture; and
   a separator tank pressure controller, connected to a non-liquid-filled region of the separator tank, configured to maintain a stable pressure within the non-liquid-filled region and to maintain a low pressure in the separator tank sufficient to draw in liquid/gas mixture from the region into the separator tank.

2. The evacuation system of claim 1, further comprising:
   a purge tank, situated lower than the separator tank and connected thereto via an opening in a lower portion of the separator tank and an opening in an upper portion of the purge tank, the connection being controllable via a purge valve; and
   a pressure equalization connection, controllable by a pressure equalization valve, configured to connect respective upper portions of the separator and purge tanks to facilitate flow of separated liquid from the separator tank to the purge tank without a change in pressure in the separator tank,
   wherein the purge tank is configured so that liquid can be removed therefrom, during a liquid removal phase, by closing the purge valve, closing the pressure equalization valve and opening the purge tank to a liquid sink via a liquid sink valve.

3. The evacuation system of claim 2, further comprising a high pressure gas source connectable to the purge tank and configured to force liquid from the purge tank to the liquid sink at an increased rate.

4. The evacuation system of claim 3, further comprising a liquid pump configured to pump liquid from the separator tank to the liquid sink, the liquid pump comprising a gas jet pump powered by the high pressure gas source.

5. The evacuation system of claim 2, wherein the purge valve, the liquid sink valve, or both comprises a check valve configured to prevent backflow.

6. The evacuation system of claim 1, further comprising:
   a purge tank, situated lower than the separator tank and connected thereto via an opening in a lower portion of the separator tank and an opening in an upper portion of the purge tank, the connection being controllable via a purge valve; and
   a limited flow connection configured to connect respective upper portions of the separator and purge tanks and comprising a flow restriction device arranged to provide a flow impedance,
   wherein the purge tank is configured so that liquid can be removed therefrom, during a liquid removal phase, by closing the purge valve and opening the purge tank to a liquid sink via a liquid sink valve, and the flow impedance is selected to equalize the pressures of the separator and purge tanks, after the liquid removal phase, without causing a fluctuation of the pressure in the separator tank that exceeds a threshold value.

7. The evacuation system of claim 6, wherein the flow impedance is also selected to allow liquid to flow from the separator tank to the purge tank at a rate above a minimum transfer rate.

8. The evacuation system of claim 6, further comprising a high pressure gas source connectable to the purge tank and configured to force liquid from the purge tank to the liquid sink at an increased rate.

9. The evacuation system of claim 6, wherein the purge valve, the liquid sink valve, or both comprises a check valve configured to prevent backflow.

10. The evacuation system of claim 1, further comprising:
    a purge tank, situated lower than the separator tank and connected thereto via an opening in a lower portion of the separator tank and an opening in an upper portion of the purge tank, the connection being controllable via a purge valve;
    a limited flow connection configured to connect respective upper portions of the separator and purge tanks and comprising a flow restriction device arranged to provide a flow impedance; and
    a pressure equalization connection, controllable by a pressure equalization valve, configured to connect respective upper portions of the separator and purge tanks to facilitate flow of separated liquid from the separator tank to the purge tank without a change in pressure in the separator tank,
    wherein the purge tank is configured so that liquid can be removed therefrom, during a liquid removal phase, by closing the purge valve and opening the purge tank to a liquid sink via a liquid sink valve, and the flow impedance is selected to equalize the pressures of the separator and purge tanks, after the liquid removal phase, without causing a fluctuation of the pressure in the separator tank that exceeds a threshold value.

11. The evacuation system of claim 10, wherein the evacuation system further comprises a high pressure gas source connectable to the purge tank and configured to force liquid from the purge tank to the liquid sink at an increased rate.

12. The evacuation system of claim 10, wherein the purge valve, the liquid sink valve, or both comprises a check valve configured to prevent backflow.

13. The evacuation system of claim 10, wherein the evacuation system further comprises a liquid pump configured to pump liquid from the separator tank to the liquid sink.

14. The evacuation system of claim 1, wherein the separator tank pressure controller comprises:
    a main pumping line connected to a two-phase compatible pump configured to pump the mixture; and
    a backup line connectable to a shared vacuum facility configured to pump gas only,
    wherein the main pumping and backup lines are connected to the separator tank, and the two-phase compatible pump being configurable to provide a deeper vacuum than the shared vacuum facility.

15. The evacuation system of claim 14, wherein the main pumping line is connected to a lower, predominantly liquid filled portion of the separator tank, and the backup line is connected to an upper, predominantly gas filled portion of the separator tank.

16. The evacuation system of claim 14, wherein the main and backup pumping lines are each fitted with check valves to prevent one pumping line from drawing on the other pumping line.

17. The evacuation system of claim 14, wherein the backup line comprises a hydrophobic filter configured to prevent liquid from reaching the shared vacuum facility.

18. The evacuation system of claim 14, wherein the main pumping line, the backup line, or both, comprise a back-pressure regulator configured to control the pumping power provided by the two-phase compatible pump, the shared vacuum facility, or both, as a function of the pressure on a separator tank side of the back-pressure regulator.

19. The evacuation system of claim 14, wherein the two-phase compatible pump is configured both to maintain a vacuum level in a non-liquid-filled portion of the separator tank via the main pumping line and to extract liquid from a lower, predominantly liquid filled portion of the separator, tank via a lower separator tank pumping line, wherein a check valve is positioned between the main pumping line and the lower separator tank pumping line so as to prevent the shared vacuum facility from pumping on the liquid.

20. The evacuation system of claim 1, further comprising a pressurized gas input configured to provide gas under pressure to an interface region of a container from which liquid may escape, a flow of gas caused by the pressurized gas input coupled with the stabilized evacuation system being configured to limit the escape of liquid from the container through the interface region.

21. A method for removing a mixture of liquid and gas from a region, comprising:
  controlled removing of the mixture from the region into a tank by a low pressure in the tank sufficient to draw in liquid/gas mixture from the region into the tank;
  separating, in the tank, liquid from gas in the mixture; and
  pumping on a non-liquid-filled region of the tank so as to maintain a stable pressure within the non-liquid-filled region.

22. The method of claim 21, further comprising providing a flow of gas under pressure to an interface region of a container from which liquid may escape, the flow of gas coupled with the controlled removal of the mixture being configured to limit the escape of liquid from the container through the interface region.

23. An evacuation system configured to draw a mixture of liquid and gas from a region comprising:
  a main pumping line connected to a two-phase compatible pump configured to pump the mixture;
  a backup line connectable to a shared vacuum facility configured to pump gas only and arranged to backup the two-phase compatible pump, the two-phase compatible pump being configurable to provide a deeper vacuum than the shared vacuum facility, and
  a two-phase-compatible pressure regulator connected to the main pumping line and the backup line.

24. The evacuation system of claim 23 further comprising:
  a liquid/gas homogenizer to provide a uniform mixture of liquid and gas to the two-phase compatible pump.

25. The evacuation system of claim 24, wherein the liquid/gas homogenizer comprises a holding tank and a porous block, the porous block configured to homogenize the mixture as it is passed into the holding tank.

26. The evacuation system of claim 23, wherein the backup line comprises a hydrophobic filter configured to prevent liquid from reaching the shared vacuum facility.

* * * * *

UNITED STATES PATENT AND TRADEMARK OFFICE
CERTIFICATE OF CORRECTION

PATENT NO. : 8,004,652 B2  
APPLICATION NO. : 12/078635  
DATED : August 23, 2011  
INVENTOR(S) : Jeroen Johannes Sophia Maria Mertens et al.

Page 1 of 1

It is certified that error appears in the above-identified patent and that said Letters Patent is hereby corrected as shown below:

Item (56) References Cited - Other Publications, Page 3, Column 2, lines 10-12 replace "English Translation of Notice of Reasons for Rejection Application No. 2005-301607 dated Mar. 9, 2009 for Japanese Patent Application No. 2005-307607 dated Mar. 9, 2009"

with --English Translation of Notice of Reasons for Rejection for Japanese Patent Application No. 2005-301607 dated Mar. 9, 2009--.

Signed and Sealed this  
Eighteenth Day of October, 2011

David J. Kappos  
*Director of the United States Patent and Trademark Office*